(12) United States Patent
Yu et al.

(10) Patent No.: US 8,408,506 B2
(45) Date of Patent: Apr. 2, 2013

(54) MOUNTING APPRATUS FOR SLIDE RAIL

(75) Inventors: Mo-Ming Yu, Shenzhen (CN); Guang-Hua Gu, Shenzhen (CN); Lin-Ren Gu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 414 days.

(21) Appl. No.: 12/790,873

(22) Filed: May 31, 2010

(65) Prior Publication Data
US 2011/0192946 A1    Aug. 11, 2011

(30) Foreign Application Priority Data
Feb. 5, 2010  (CN) .......................... 2010 1 0301267

(51) Int. Cl.
*A47B 96/06*   (2006.01)
*A47G 29/00*   (2006.01)
*E04G 3/00*    (2006.01)
*F21V 35/00*   (2006.01)

(52) U.S. Cl. ........... 248/219.1; 248/220.22; 248/220.31; 312/265.1

(58) Field of Classification Search ............... 248/219.1, 248/220.22, 220.31, 221.11, 222.11, 225.11; 312/265.1, 265.4
See application file for complete search history.

(56) References Cited

U.S. PATENT DOCUMENTS

| | | | |
|---|---|---|---|
| 6,773,080 B2 * | 8/2004 | Chen et al. ................. | 312/265.1 |
| 6,935,711 B1 * | 8/2005 | Naue et al. ................. | 312/334.4 |
| 7,144,184 B1 * | 12/2006 | Tsai .............................. | 403/350 |
| 8,079,654 B2 * | 12/2011 | Yu et al. ..................... | 312/334.4 |
| 8,146,756 B2 * | 4/2012 | Brock et al. ................. | 211/192 |
| 2005/0156493 A1 * | 7/2005 | Yang et al. ................. | 312/334.5 |

* cited by examiner

*Primary Examiner* — Amy J. Sterling
(74) *Attorney, Agent, or Firm* — Altis Law Group, Inc.

(57) ABSTRACT

A mounting apparatus includes a supporting bracket, a locking member, and a holding mechanism. The supporting bracket is fixed to a slide rail and includes two inserting pins extending through the two corresponding through holes of a rack post. The locking member is slidably mounted to the supporting bracket. When the locking member slides to abut against a front surface of the rack post, the slide rail is prevented from moving backwards to make the inserting pins disengage from the through holes. When the locking member slides to space away from the rack post, the slide rail is enable to move backwards to make the inserting pins disengage from the through holes. The holding mechanism abuts against the locking member to prevent the locking member from sliding. The holding mechanism is operable to move away from the locking member.

11 Claims, 8 Drawing Sheets

MOUNTING APPRATUS FOR SLIDE RAIL

BACKGROUND

1. Technical Field

The present disclosure relates to mounting apparatuses and, more particularly, to a mounting apparatus for a slide rail.

2. Description of the Related Art

Traditionally, slide rails are used to slidably mount elements on larger stationary elements, such as a drawer on a desk, a server on a rack, etc.

A conventional slide rail assembly for a drawer and a desk includes an outer slide rail mounted to the desk, an inner slide rail mounted to the drawer, and an intermediate slide rail mounted between the outer and inner slide rails. The intermediate slide rail is extendable relative to the outer slide rail, and the inner slide rail is extendable relative to the intermediate slide rail, thus the drawer can be extended a distance out from the desk. Screws mounting the outer slide rail to a bracket of the desk render installation and removal of the outer slide rail to/from the bracket inconvenient and time-consuming.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
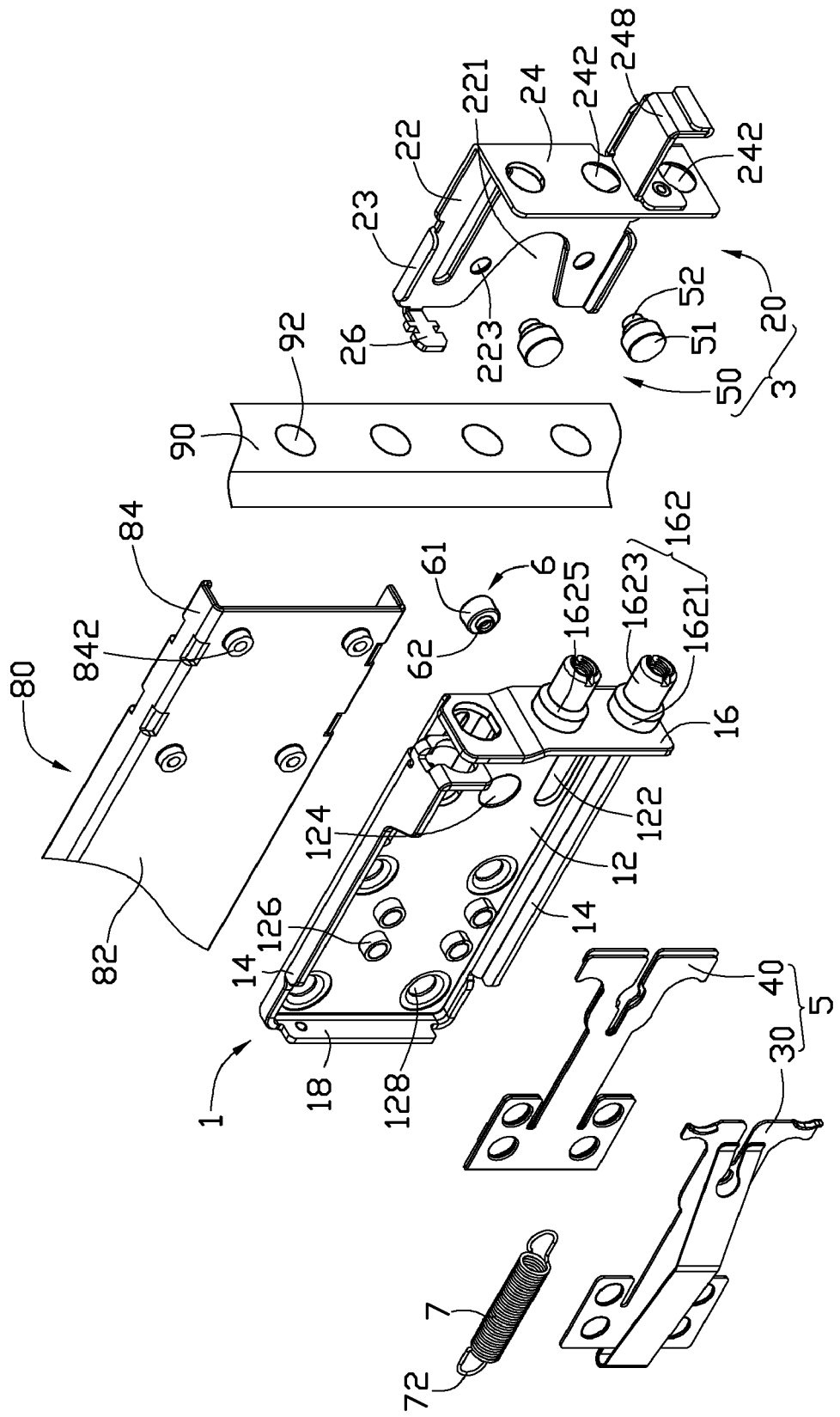
FIG. 1 is an exploded, isometric view of an embodiment of a mounting apparatus, a slide rail, and a rack post, the mounting apparatus including a supporting bracket, a locking member, a holding mechanism, a button, and a resilient member.

Referring to FIG. 1, an embodiment of a mounting apparatus is provided for mounting a slide rail 80 to a rack post 90 defining a plurality of through holes 92. The mounting apparatus includes a supporting bracket 1, a locking member 3, a holding mechanism 5, a button 6, and a resilient member 7.

The slide rail 80 defines a substantially C-shaped cross section, and includes a web 82 with two flanges 84 extending from upper and lower sides of the web 82, respectively. The web 82 forms a plurality of protrusions 842 extending from an outer side of the web 82.

The supporting bracket 1 includes a sidewall 12, two flanges 14 perpendicularly extending from upper and lower sides of the sidewall 12, an end plate 16 perpendicularly extending from a front end of the sidewall 12, and an engaging tab 18 perpendicularly extending from a rear end of the sidewall 12. The sidewall 12 defines two parallel first sliding slots 122 extending in a longitudinal direction of the sidewall 12, adjacent to the end plate 16. The sidewall 12 defines a second sliding slot 123 (shown in FIG. 4) extending parallel to the first sliding slots 122, and arranged at a top side of the first sliding slots 122. A through hole 124 is defined in the sidewall 122, between the two first sliding slots 122. A plurality of fixing holes 128 is defined in the sidewall 12 adjacent to the engaging tab 18. A plurality of protrusions 126 protrudes from an outer side of the sidewall 12, and arranged in an area bounded by the plurality of fixing holes 128. Two inserting pins 162 extend forward from the end plate 16 of the supporting bracket 10. Each of the inserting pins 162 includes a first inserting segment 1621 extending from the end plate 16, and a second inserting segment 1623 extending from the first inserting segment 1621. A shoulder 1625 is formed at a distal end of the first inserting segment 1621 facing the second inserting segment 1623. In one embodiment, each of the through holes 92 is adapted to receive the second inserting segment 1623 of a corresponding inserting pin 162, but is not able to receive the first inserting segment 1621 of the inserting pin 162.

The locking member 3 includes a sliding bracket 20 and two positioning pins 50. The sliding bracket 20 includes a side panel 22, two flanges 23 extending outwards from upper and lower sides of the side panel 22, a blocking plate 24 perpendicularly extending from a front end of the side panel 22, and an engaging tab 26 extending from a rear end of the side panel 22. A V-shaped opening 221 is defined in the rear end of the side panel 22. Two positioning holes 223 are defined in the side panel 22, near upper and lower sides of the opening 221, respectively. The blocking plate 24 defines two through holes 242 therein. A handle 248 extends forwards from the blocking plate 24. Each of the positioning pins 50 includes a cylindrical main body 51 and a retaining portion 52 extending from an end of the main body.

Figure 2:
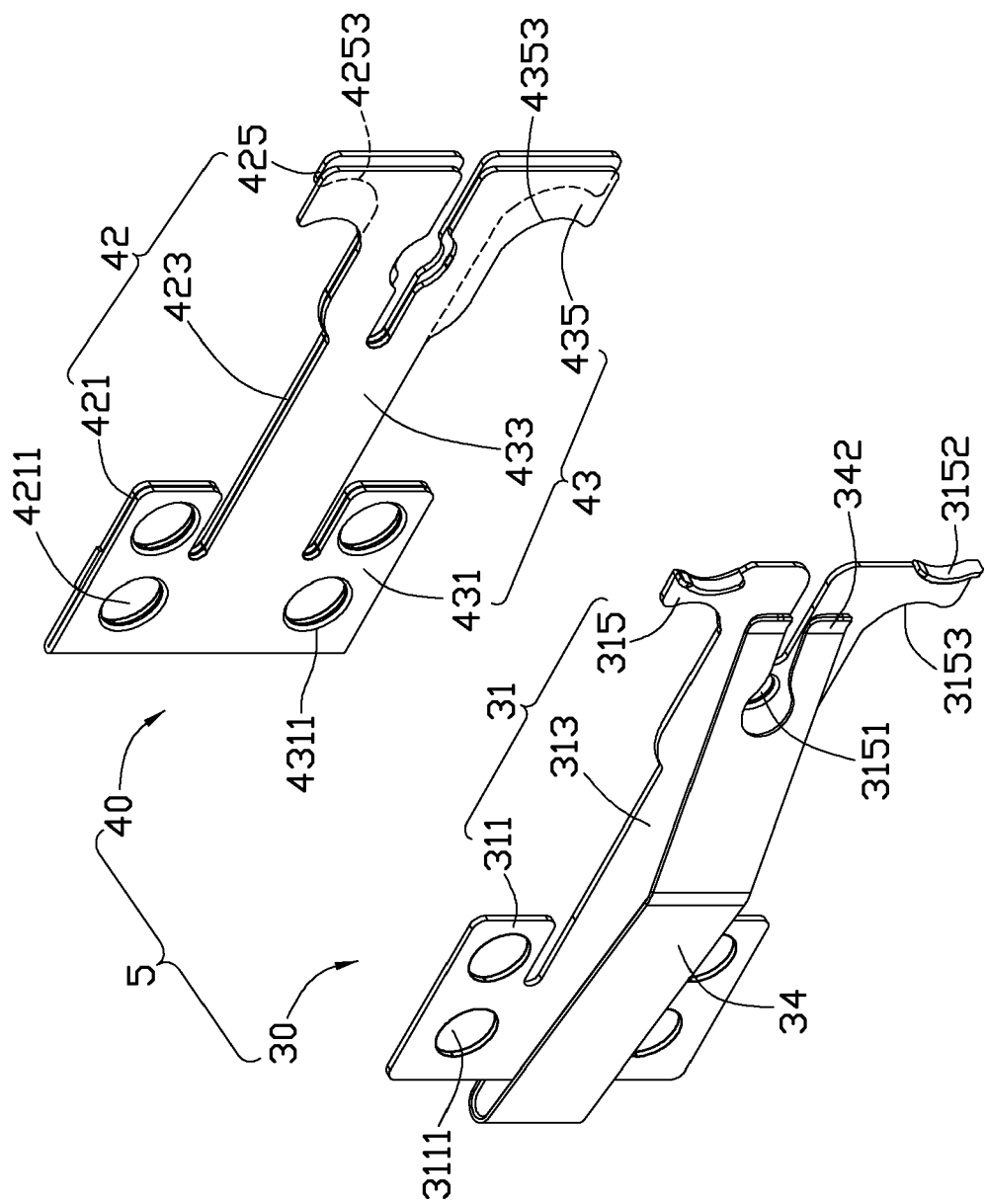
FIG. 2 is an enlarged view of the holding mechanism of FIG. 1.
Figure 3:
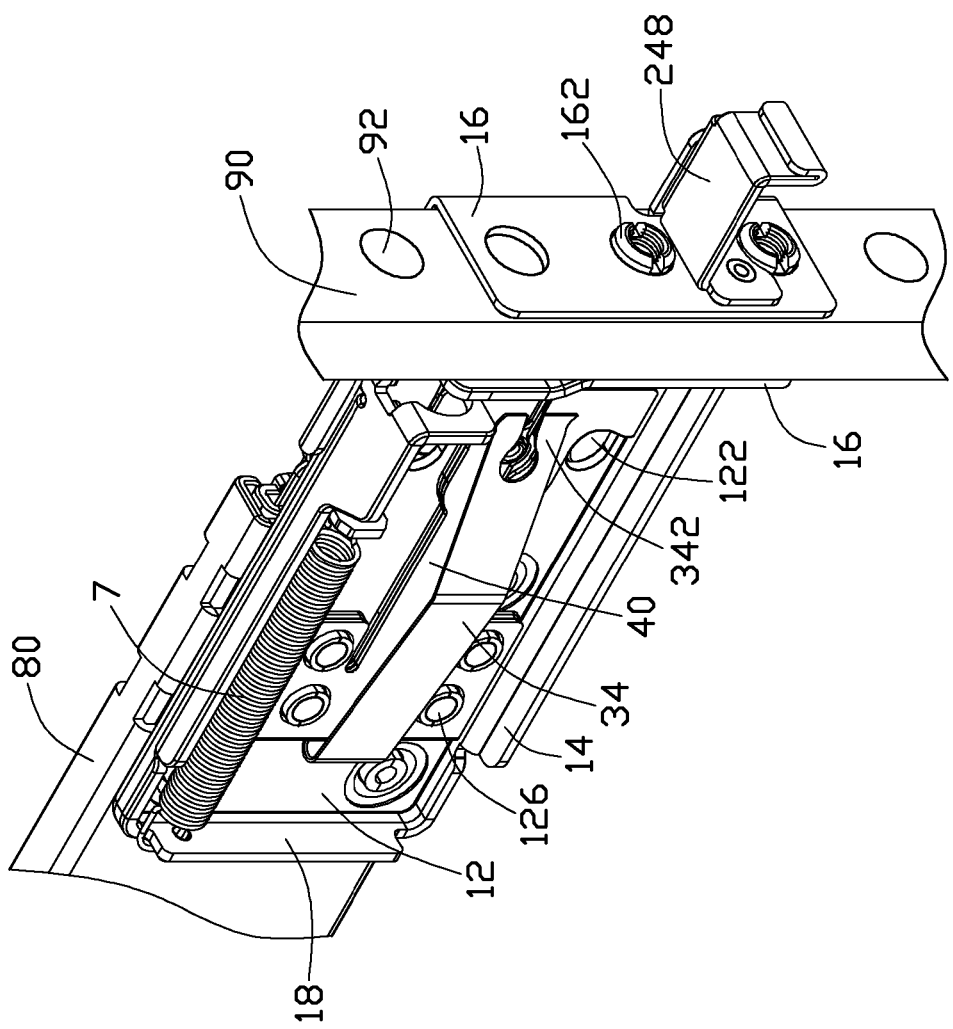
FIG. 3 is an assembled view of FIG. 1.

Referring to FIG. 2, the holding mechanism 5 includes a first holding member 30 and a second holding member 40. In one embodiment, the first holding member 30 and the second holding member 40 are resilient metal plates. The first holding member 30 includes a first holding plate 31 and a pressing tab 34. The first holding plate 31 includes a mounting portion 311, an elongating portion 313 extending from a front end of the mounting portion 311, and two L-shaped first engaging portions 315 extending from a front end of the elongating portion 313. A plurality of securing holes 3111 is defined in the mounting portion 311. A bonding hole 3151 is defined in the elongating portion 313, between the first engaging portions 315. Each of the first engaging portions 315 forms a forward end 3152, and a first abutting end 3153 opposite to the forward end 3152 and facing the mounting portion 311. The pressing tab 34 extending forwards from a rear end of the mounting portion 311 of the first holding plate 31, and two spaced pressing portions 342 elastically resisting against the corresponding engaging portions 315 of the holding plate 31. The second holding member 40 includes a second holding plate 42 and a third holding plate 43 overlapping each other. The second holding plate 42 includes a mounting portion 421, an elongating portion 423 extending from a front end of the mounting portion 421, and two L-shaped second engaging portions 425 extending from a front end of the elongating portion 423. The mounting portion 421 defines a plurality of securing holes 4211. Each of the second engaging portions 425 forms a second abutting end 4253 facing the mounting portion 421. The third holding plate 43 includes a mounting portion 431, an elongating portion 433 extending from a front end of the mounting portion 431, and two L-shaped third engaging portions 435 extending from a front end of the elongating portion 433. The mounting portion 423 defines a plurality of securing holes 4311 aligning with the corresponding securing holes 4211 of the second holding plate 42. Each of the third engaging portions 435 forms a third abutting end 4353 facing the mounting portion 431.

Referring to FIG. 1 again, the button 6 includes a cylindrical main body 61 with a diameter smaller than the through hole 124 of the supporting bracket 1, and a fixing portion 62 extending from an end of the main body 61.

In one embodiment, the resilient member 7 is a coil spring with two hooks 72 correspondingly formed at opposite ends of the resilient member 7.

Referring to FIGS. 3 to 6, in assembly, the second holding member 40 is inserted between the first holding plate 31 and the pressing tab 34 of the first holding member 30, with the first holding plate 31 abutting against the second holding plate 42, and the pressing portions 342 of the pressing tab 34 resisting against the corresponding third engaging portions 435 of the third holding plate 43. The securing holes 4211 of the second holding member 40 are correspondingly aligned with the securing holes 3111 of the first holding member 30. The button 6 is mounted to a side of the first holding plate 31 opposite to pressing tab 34, with the fixing portion 62 of the button 6 fixed in the bonding hole 3151 of the first holding plate 31. The holding mechanism 5 is mounted to the supporting bracket 1, with the protrusions 126 of the supporting bracket 1 fixed in the securing holes 3111 of the first holding member 30, and the securing holes 4211 and 4311 of the second holding member 40. The main body 61 of the button 6 extends through the through hole 124 of the sidewall 12 of the supporting bracket 1.

The sliding bracket 20 is slidably coupled to the supporting bracket 1 with the engaging tab 26 slidably engaged in the second sliding slot 123. The two positioning pins 50 are fixed to the sliding bracket 20, and are slidable relative to the supporting bracket 1, with the fixing portions 52 of the positioning pins 50 extending through the corresponding first sliding slots 122 and retained in the corresponding positioning holes 223 of the sliding bracket 20. The hooks 72 of the resilient member 7 are correspondingly engaged with the engaging tab 18 of the supporting bracket 1 and the engaging tab 26 of the sliding bracket 20. The resilient member 7 presses the sliding bracket 20 to slide relative to the supporting bracket 1 to make the inserting pins 162 extend through the through holes 242 of the blocking plate 24 of the sliding bracket 20. The positioning pins 50 are adjacent to rear ends of the corresponding first sliding slots 122 opposite to the end plate 16, and each are blocked by the corresponding first to third abutting ends 3153, 4253, and 4353.

The mounting apparatus is installed to the slide rail 80 with the protrusions 842 of the slide rail 80 correspondingly fixed in the fixing holes 128 of the supporting bracket 1.

Figure 4:
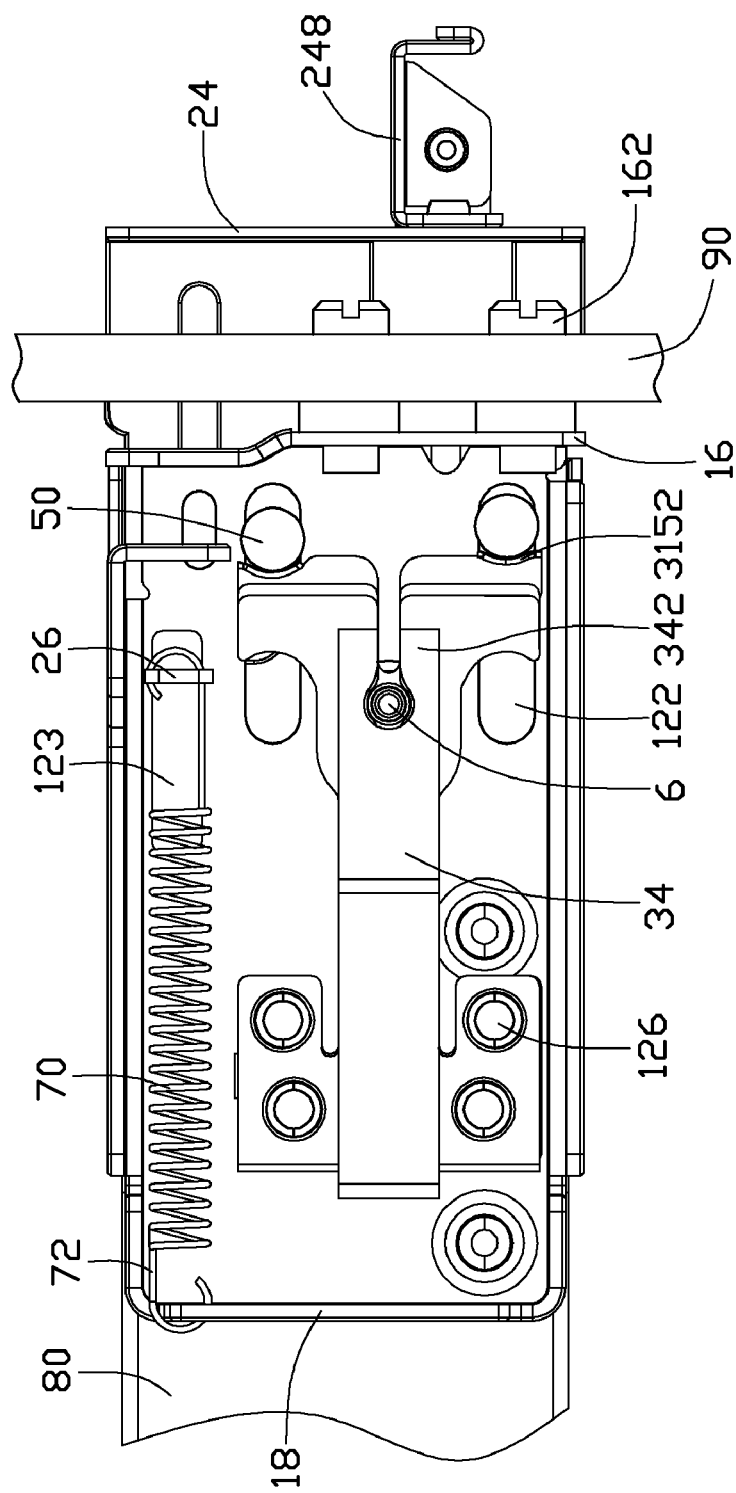
FIGS. 4 and 5 are side planar views of FIG. 3, respectively showing the locking member in unlocked and locked positions.
Figure 5:
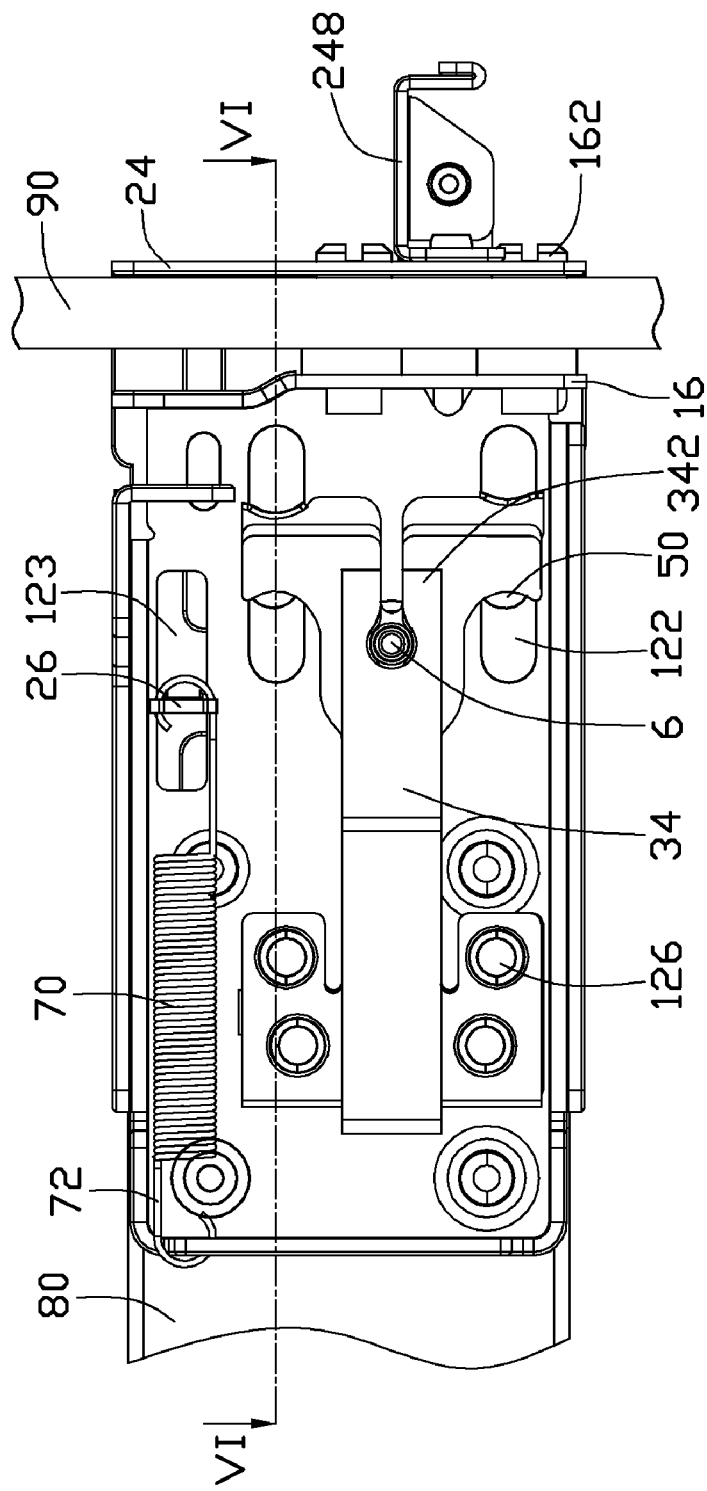
Figure 6:
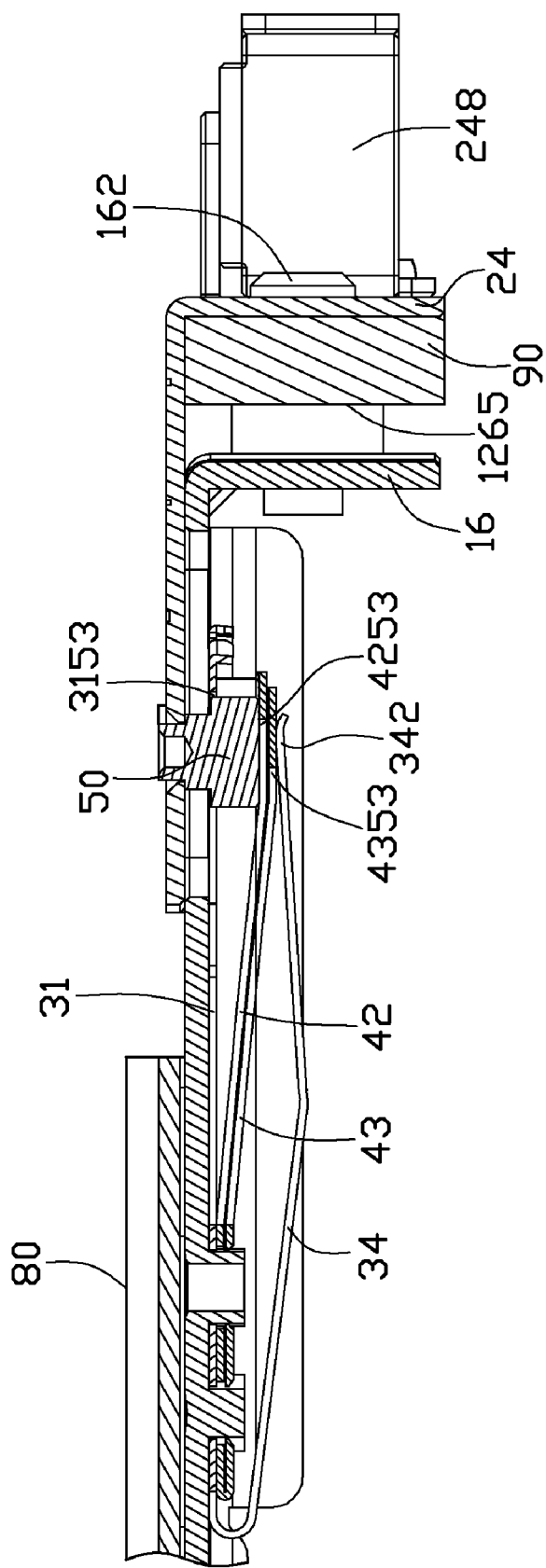
FIG. 6 is a sectional view taken along line VII-VII of FIG. 5.

Referring to FIG. 4, to mount the slide rail 80 to the rack post 90, the main body 61 of the button 6 is pushed to move the first engaging portions 315 of the first holding plate 31, the second engaging portions 425 of the second holding plate 42, and the third engaging portions 435 of the third holding plate 43 away from the sidewall 12 of the supporting bracket 1, until the first to third abutting ends 3153, 4253, and 4353 release the main bodies 51 of the positioning pins 50, thereby the positioning pins 50 are capable of sliding forwards along the corresponding first sliding slots 122. The handle 248 is operated to pull the sliding bracket 20 forwards, the position pins 50 move with the sliding bracket 20 towards front ends of the corresponding first sliding slots 122 of the supporting bracket 1. The resilient member 7 is deformed. The blocking plate 24 of the sliding bracket 20 moves away from the end plate 16 of the supporting bracket 1 to make the inserting pins 162 disengage from the corresponding through holes 242 of the blocking plate 24. The button 6 is released, the holding mechanism 5 restores to make the first holding plate 31, the second holding plate 42, and the third holding plate 43 stacked up one by one, and the first holding plate 31 tightly abuts against the sidewall 12 of the supporting bracket 1. The handle 248 is released. The resilient member 7 restores to pull the sliding bracket 20 backwards until the positioning pins 50 abut against the forward ends 3152 of the corresponding engaging portions 315 of the first holding plate 31. Therefore, the locking member 3 is kept in an unlocked position, adapted to engage with the rack post 90.

The slide rail 80 is handled to insert the inserting pins 162 into the corresponding through holes 92 of the rack post 90, until the shoulders 1625 of the inserting pins 162 abut against a rear surface of the rack post 90. The button 6 is pushed to move the first engaging portions 315 of the first holding plate 31, the second engaging portions 425 of the second holding plate 42, and the third engaging portions 435 of the third holding plate 43 away from the sidewall 12 of the supporting bracket 1 to disengage the holding mechanism 5 form the positioning pins 50. The sliding bracket 20 is slid backwards by the resilient member 7 restoring, until the blocking plate 24 abuts against a front surface of the rack post 90 to tightly sandwich the rack post 90 between the blocking plate 24 and the shoulders 1625 of the inserting pins 162. At the same time, the positioning pins 50 slide with the sliding bracket 20 along the corresponding first sliding slots 122 of the supporting bracket 1 to approach to the rear ends of the first slide slots 122. The button 6 is released, the holding mechanism 5 restores. The first engaging portions 315 of the first holding plate 31 move to resist against the sidewall 12 of the supporting bracket 1, but the restoring of the second holding plate 42 is blocked by the positioning pins 50 to make the second engaging portions 425 of the second holding plate 42 separate from the corresponding first engaging portions 315 of the first holding plate 31. The first abutting ends 3153 of the first engaging portions 315 of the first holding plate 31 abut rear sides of the corresponding positioning pins 50 to keep the sliding bracket 20 in a locked position where the slide rail 80 is retained to the rack post 90 by the mounting apparatus.

When the slide rail 80 is mounted to a rack post thinner than the rack post 90, the positioning pins 50 may just block the restoring of the third holding plate 43 or not block the holding mechanism at all. Accordingly, the sliding bracket 20 is prevented from sliding forwards by abutment between the positioning pins 50 and the second abutting ends 4253 of the second holding plate 42, or between the positioning pins 50 and the third abutting ends 4353 of the third holding plate 43.

To detach the slide rail 80 from the first rack post 90, the button 6 is pushed to move the first engaging portions 315, the second engaging portions 425, and the third engaging portions 435 away from the sidewall 12 of the supporting bracket 1, until the positioning pins 50 are capable of sliding forwards along the corresponding first sliding slots 122 without being stopped by the holding mechanism 5. The handle 248 is operated to pull the sliding bracket 20 forwards to the unlocked position. The slide rail 80 is handled to disengage the inserting pins 162 from the corresponding through holes 92 of the rack post 90, and the slide rail 80 is detached from the rack post 90.

Figure 7:
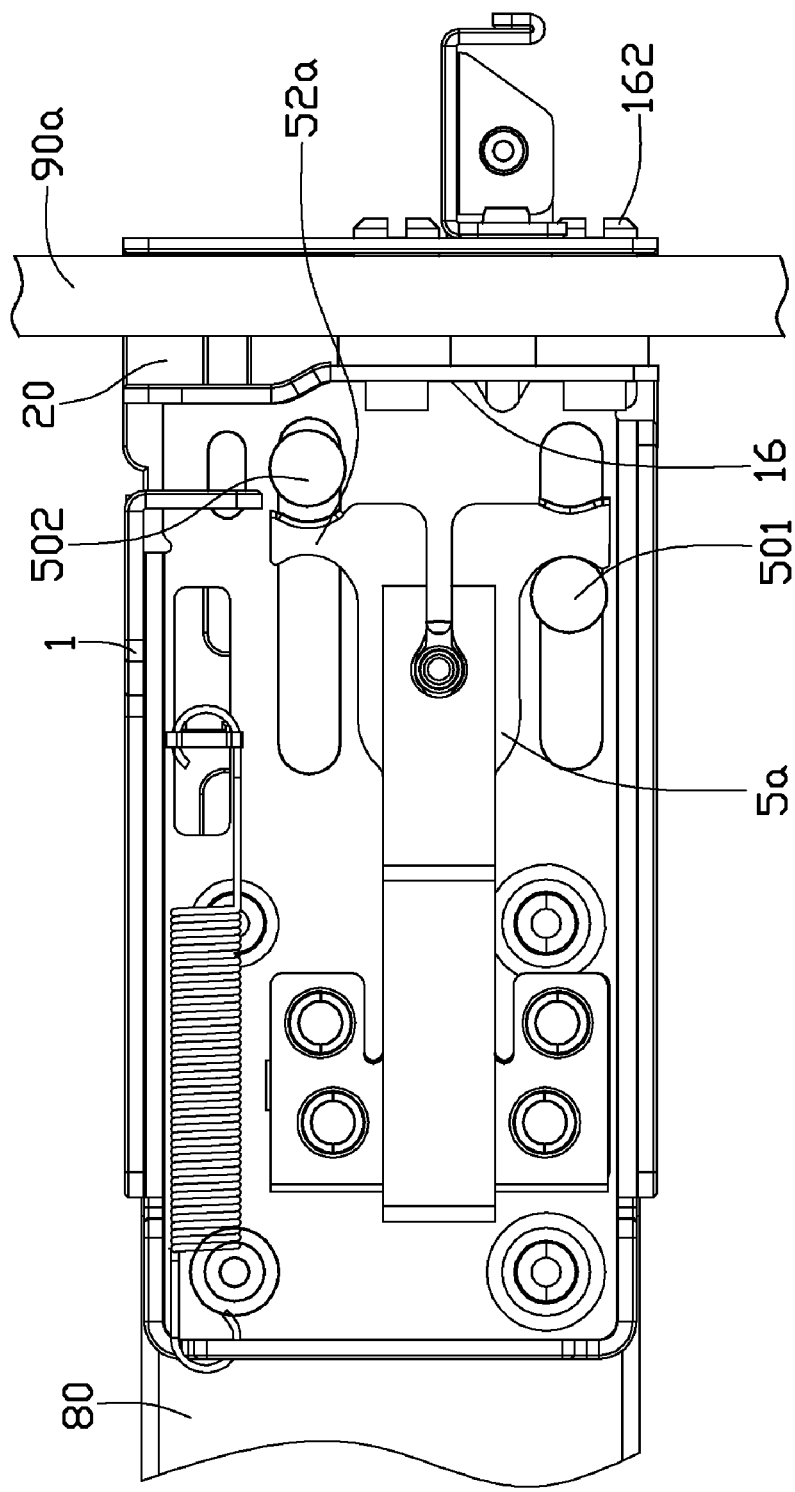
FIGS. 7 and 8 are side planar views showing another embodiment of a mounting apparatus mounted to different rack posts.
Figure 8:
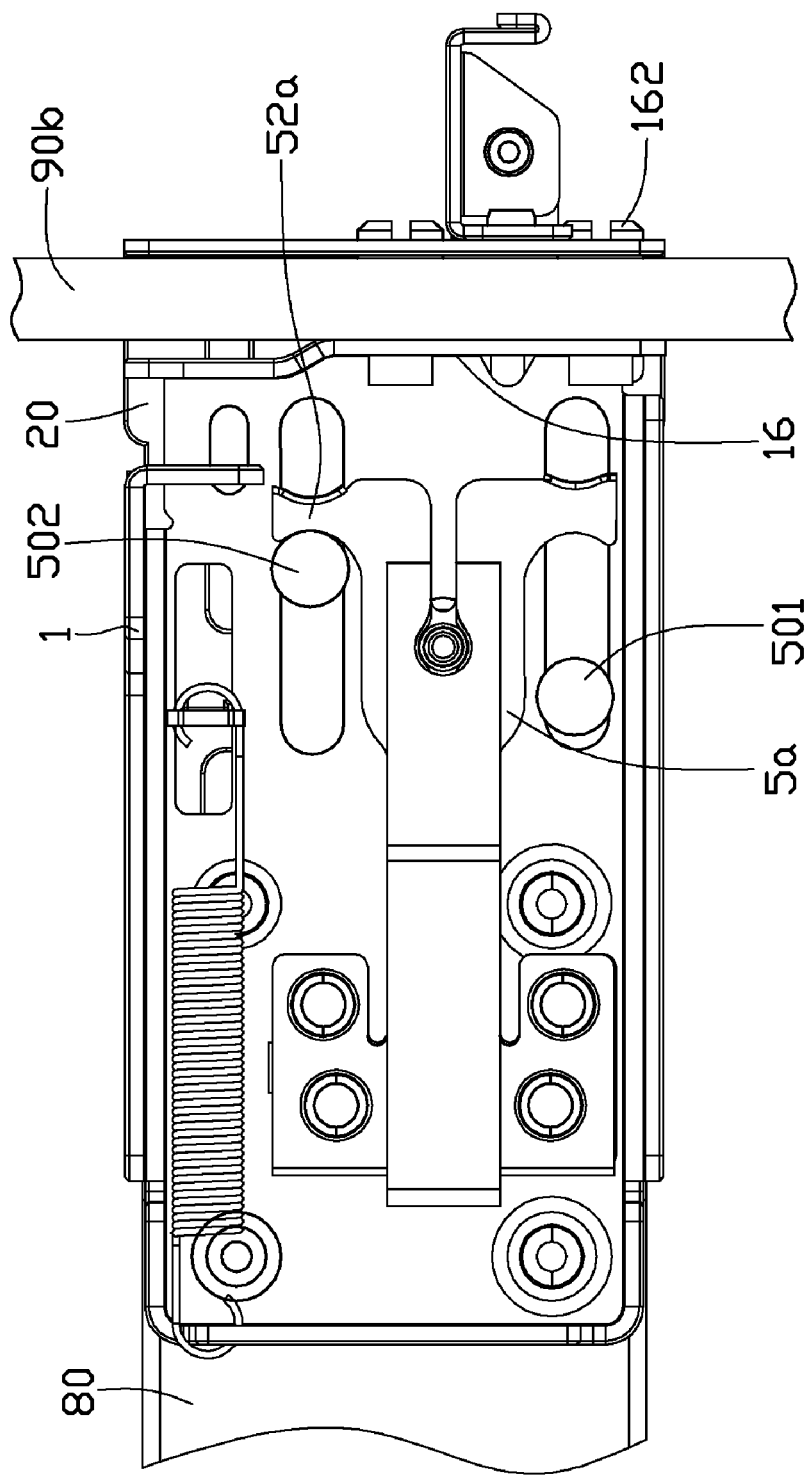

Referring to FIGS. 7 and 8, another embodiment of a mounting apparatus is provided to mount the slide rail 80 to either the rack post 90a or the rack post 90b. The rack post 90a defines a plurality of round through holes (not shown) being able to receive the second inserting segments 1623 of the corresponding inserting pins 162, but not able to receive the first inserting segments 1621 of the corresponding inserting pins 162. The rack post 90b defines a plurality of rectangular through holes (not shown) being able to receive the first inserting segments 1621 of the corresponding inserting pins 162. The mounting apparatus includes a holding mechanism 5a, a first positioning pin 501, and a second positioning pin 502 being closer to the end plate 16 of the supporting bracket 1 than the first positioning pin 501. When the slide rail 80 is mounted to a rack post 90a with the shoulders 1625 of the inserting pins 162 abut against a rear side of the rack post 90a, the sliding bracket 20 is kept at the locking position with engaging portions 52a of the holding mechanism 5a disposed between the first positioning pin 501 and the second positioning pin 502, and the first positioning pin 501 abutting against one of the engaging portions 52a. When the slide rail 80 is mounted to a rack post 90b with the blocking plate 16 of the sliding bracket 20 abutting against a rear side of the rack post 90b, the sliding bracket 20 is kept at the locked position with the engaging portions 52a of the holding mechanism 5a disposed at rear sides of the first positioning pin 501 and the second positioning pin 502, and the second positioning pin 501 abutting against one of the engaging portions 52a.

It is believed that the present embodiment and its advantages will be understood from the foregoing description, and it will be apparent that various changes may be made thereto without departing from the spirit and scope of the description or sacrificing all of its material advantages, the examples hereinbefore described merely being exemplary embodiments.

What is claimed is:

1. A mounting apparatus for mounting a slide rail to a rack post, the rack post defining a through hole, the mounting apparatus comprising:
    a supporting bracket fixed to the slide rail, the supporting bracket comprising an end plate and an inserting pin extending from the end plate to extend through the through hole of the rack post;
    a locking member slidably coupled to the supporting bracket between a locking position where the locking member abutting against a side of the rack post opposite to the end plate of the supporting bracket to prevent the inserting pin from disengaging from the through hole of the rack post, and an unlocking position where the locking member moves away from the rack post to enable the inserting pin to disengage from the through hole of the rack post; and
    a holding mechanism comprising at least one holding plate mounted to the supporting bracket, and a resilient pressing tab integrally extending from one of the at least one holding plate and comprising a pressing portion resisting against the at least one holding plate;
    wherein the at least one holding plate is movable between a first position where the at least one holding plate abuts against the locking member to prevent the locking member from sliding relative to the supporting bracket, and a second position where the at least one holding plate disengages from the locking member, the pressing tab biases the at least one holding plate towards the first position; and
    wherein the locking member comprises a sliding bracket slidably engaging with the supporting bracket, and a positioning pin secured to the sliding bracket, the at least one holding plate comprises a first holding plate, a second holding plate, and a third holding plate, the first holding plate comprises a first engaging portion, the second holding plate comprises a second engaging portion closer to the end plate of the supporting bracket than the first engaging portion, the third holding plate comprises a third engaging portion closer to the end plate of the supporting bracket than the first engaging portion, one of the first engaging portion, the second engaging portion, and the third engaging portion abuts against the positioning pin to prevent the sliding of the locking member.

2. The mounting apparatus of claim 1, further comprising a resilient member connected between the supporting bracket and the locking member to bias the locking member to the locking position.

3. The mounting apparatus of claim 2, wherein the resilient member is a coil spring comprising two hooks at opposite ends of the resilient member, the hooks of the resilient member respectively engage with the supporting bracket and the locking member.

4. The mounting apparatus of claim 1, wherein the sliding bracket comprises a blocking plate to abut against the side of the rack post opposite to the end plate of the supporting bracket in response to the locking member sliding to the locking position.

5. The mounting apparatus of claim 1, wherein the supporting bracket defines a sliding slot extending along a sliding direction of the locking member, the positioning pin extends through the sliding slot.

6. A mounting apparatus for mounting a slide rail to a rack post, the rack post defining a through hole, the mounting apparatus comprising:
    a supporting bracket fixed to the slide rail, the supporting bracket comprising an end plate and an inserting pin extending from the end plate to extend through the through hole of the rack post;
    a locking member slidably coupled to the supporting bracket between a locking position where the locking member abutting against a side of the rack post opposite to the end plate of the supporting bracket to prevent the inserting pin from disengaging from the through hole of the rack post, and an unlocking position where the locking member moves away from the rack post to enable the inserting pin to disengage from the through hole of the rack post;
    a holding mechanism comprising at least one holding plate mounted to the supporting bracket, and a resilient pressing tab integrally extending from one of the at least one holding plate and comprising a pressing portion resisting against the at least one holding plate; and
    a button extending from a side of the at least one holding plate opposite to the pressing tab;
    wherein the at least one holding plate is movable between a first position where the at least one holding plate abuts against the locking member to prevent the locking member from sliding relative to the supporting bracket, and a second position where the at least one holding plate disengages from the locking member, the pressing tab biases the at least one holding plate towards the first position.

7. The mounting apparatus of claim 6, further comprising a resilient member connected between the supporting bracket and the locking member to bias the locking member to the locking position.

8. The mounting apparatus of claim 7, wherein the resilient member is a coil spring comprising two hooks at opposite ends of the resilient member, the hooks of the resilient member respectively engage with the supporting bracket and the locking member.

9. The mounting apparatus of claim 6, where the locking member comprises a sliding bracket slidably engaging with the supporting bracket, and a positioning pin secured to the sliding bracket, the at least one holding plate comprises a first holding plate, a second holding plate, and a third holding plate, the first holding plate comprises a first engaging portion, the second holding plate comprises a second engaging portion closer to the end plate of the supporting bracket than the first engaging portion, the third holding plate comprises a third engaging portion closer to the end plate of the supporting bracket than the first engaging portion, one of the first engaging portion, the second engaging portion, and the third engaging portion abuts against the positioning pin to prevent the sliding of the locking member.

10. The mounting apparatus of claim 9, wherein the sliding bracket comprises a blocking plate to abut against the side of the rack post opposite to the end plate of the supporting bracket in response to the locking member sliding to the locking position.

11. The mounting apparatus of claim 9, wherein the supporting bracket defines a sliding slot extending along a sliding direction of the locking member, the positioning pin extends through the sliding slot.

* * * * *